United States Patent [19]

Kadota

[11] 4,381,516
[45] Apr. 26, 1983

[54] CHARGE-COUPLED DEVICE HAVING A CHANNEL AND AN ELECTRODE FOR CHANGING A TRANSFER DIRECTION OF CHARGE SIGNALS

[75] Inventor: Hiroshi Kadota, Toyonaka, Japan
[73] Assignee: Matsushita Electric Industrial Co., Ltd., Kadoma, Japan
[21] Appl. No.: 304,873
[22] Filed: Sep. 23, 1981

Related U.S. Application Data

[63] Continuation of Ser. No. 137,294, Apr. 3, 1980, abandoned.

[51] Int. Cl.³ ...................... H01L 29/78; G11C 19/28
[52] U.S. Cl. ........................................ 357/24; 377/63
[58] Field of Search ...................... 357/24; 307/221 D

[56] References Cited

U.S. PATENT DOCUMENTS

| 3,971,003 | 7/1976 | Kosonocky | 357/24 LR |
| 4,160,262 | 7/1979 | Kovac | 357/24 R |
| 4,236,830 | 12/1980 | Schlig | 357/24 R |
| 4,242,692 | 12/1980 | Hagiwara | 357/24 R |

OTHER PUBLICATIONS

Walsh "A 190X 244 Charge-Coupled Area Image Sensor..." Symposium Charge-Coupled Device Technology for Scientific Imaging Applications, Pasadena, Calif. (3/75), Proc. pp. 137-149.
Wen "A CCD Video Delay Line" IEEE Int. Solid-State Circuits Conference (2/76), Proc. pp. 204-205.

*Primary Examiner*—Gene M. Munson
*Attorney, Agent, or Firm*—Cushman, Darby & Cushman

[57] ABSTRACT

In a charge-coupled device, several bent electrodes and storage sites under the bent electrodes are disposed in a turning part for turning transfer direction of charge signal and they respectively have a first part having right angles to an initial direction and a second part having right angles to a direction to be changed, the first part decreases and the second part increases responding to a distance from an upstream part to a downstream part of the turning part.

4 Claims, 10 Drawing Figures

CHARGE-COUPLED DEVICE HAVING A CHANNEL AND AN ELECTRODE FOR CHANGING A TRANSFER DIRECTION OF CHARGE SIGNALS

This is a continuation of application Ser. No. 137,294 filed Apr. 3, 1980, now abandoned.

BACKGROUND OF THE INVENTION

1. Field of the Invention

The present invention relates to a new improvement in a construction of a charge-coupled device (hereinafter referred to CCD), and especially relates to a construction for changing a transfer direction of charge signals.

2. Description of the Prior Art

Two different kinds of constructions of CCD are known for changing a transfer direction of charge signals. One of them uses a high conductive materials, more concretely a high impurity concentration diffused region, which connects two transfer channels having different transfer directions from each other. The article "Charge Transfer Device Analog Signal Processing" by David D. Wen, et al., 1976 IEEE International Solid-State Circuits Conference P. 204 and 205 shows such arts.

FIG. 1 shows a turning part of a CCD having the high conductive material for changing transfer directions of charge signals. In FIG. 1(a), a top view, $A_{a1}$ and $A_{a2}$ designate channels to transfer signal charges, and G designates a high impurity concentration region having high conductivity of other conductivity than a substrate Sb. The channels $A_{a1}$ and $A_{a2}$ are defined by very high impurity concentration layer Hic of the same conductivity type as the substrate Sb, serving for a so called channel stop, the end line of the layer is shown by $I_1$ and it surrounds the channels $A_{a1}$ and $A_{a2}$. And $E_1$ designates a turning pitch of the CCD. In FIG. 1(b), a sectional view taken on H–H' in FIG. 1(a), an insulating film $J_1$ such as silicon oxide film is on the substrate Sb of the CCD. Electrodes $C_1$ of stripe form are disposed on the insulating film $J_1$ in a row and are respectively insulated by insulating films $J_2$. Electrodes $B_1$ are disposed between each gap of two neighboring insulating films $J_2$ as shown in FIG. 1(b). This CCD is so called a two-phase CCD which has high impurity concentration layers $K_1$ under the respective electrodes $B_1$. In this kind of CCD, the adjoining electrodes $B_1$ and $C_1$ are connected each other by contacts $D_1$. The contacts $D_1$ are also connected with every other ones each other.

In this CCD, signal charges are transferred by clock pulses applied to two kinds of electrodes $B_1$ and $C_1$ in the channel $A_{a1}$ in the direction shown by arrow $F_{a1}$. When signal charges reach the diffused region G, the transfer direction of signal charges turns from the arrow $F_{a1}$ to an arrow $F_{a2}$ by the high conductive diffused region G, and then the signal charges are transferred along the channel $A_{a2}$ leftwards of FIG. 1(a). Since the high conductive diffused region G can be arbitrarily changed in almost all desired form, the turning part of the transfer direction can be made a simple structure, and thereby a surface area utilization rate in an IC chip (namely, a rate of a part in which signal charges and current pass through and directly contributes to the operation of CCD to whole surface of an IC chip) can be increased.

However, because the diffused region G is in the channel this CCD has the following disadvantages: First, a speed which signal charges are injected again into the channel $A_{a2}$ is limited by a time constant $\tau$, which is a ratio of a stray capacity of the diffused region G against the earth to a channel conductance of a storage site St where signal charges are injected again from the diffused region G. Therefore if the time constant $\tau$ is larger than a value $\tau e$ determined by transfer frequency of the CCD, the turning parts worsen the frequency characteristics of the CCD. To minimize the stray capacity of the diffused region G for reducing the time constant $\tau$ is limited by a pattern design of the CCD. And if an effective electrode width of the electrode $C_{A1}$ namely the width of the storage site St is shortened in order to enlarge the channel conductance, it produces so called a two dimensional effect, that is, modulation of a voltage of the storage site St by an amount of signal charges, thereby the transfer efficiency of the CCD becomes worse. As described above, the turning method for changing transfer direction has the same disadvantage as that of the MOS type bucket brigade device as the frequency characteristics.

Secondly a dark current of the diffused region G is larger than that of the ordinary channel part. Since the diffused region G is in itself inserted into the two neighboring electrodes in the channel, the dark current of the diffused region is added to the dark current of one transferring stage and that of the diffused region G, and amount to several times as large as that of one transferring stage. Such characteristic becomes a serious problem especially when the CCD is used, for example, as a temporary memory device whose driving by clock pulse is temporarily halted and from which memorized data in the CCD are read after a short time. If the dark current is generated in the CCD uniformly and entirely, only a DC voltage based on the dark current is added to an output signal of the CCD. However, in such CCD, since the dark current of diffused region G is larger than every other channel, a fixed pattern noise is added to the output signal, and thereby a noise characteristic of the CCD becomes very worse. Therefore, nowadays such method using the diffused region is hardly used.

Other prior art is mentioned below. FIG. 2 shows a construction of CCD to change a transfer direction of charge signals. In this CCD, symbols $A_b$, $B_2$, $C_2$, $D_2$, $E_2$ and $I_2$ correspond respectively to the counterparts of FIG. 1, the channel $A_a$, the electrode $B_1$, the electrode $C_1$, the contact $D_1$, the turning pitch $E_1$ and the end line of channel stop $I_1$. And a symbol L shows a length correspond to one bit of the CCD. As illustrated in FIG. 2, the electrodes $B_2$ and $C_2$ and channel $A_b$ are arranged in a shape of a semi-circle, and the transfer direction of signal charges is changed from an arrow $F_{b1}$ to an arrow $F_{b2}$. In the CCD of this type, since a considerable area which can not be used is retained in the center of the circle, a surface area utilization rate in an IC chip is low. The reason is further described below in detail referring to FIG. 3.

Providing:
R; outer radius of the channel $A_b$
r; inner radius of the channel $A_b$
$A_w$; width of the channel $A_b$
$\theta$; angle between both side lines of the electrode $C_2$,
the following relations hold.

$$R - r = A_w$$

$$L_o \approx R \cdot \theta$$

($L_o$; outer length of the electrode within the channel $A_b$)

$$L_i \approx r \cdot \theta$$

($L_i$; inner length of the electrode within the channel $A_b$)

By the way, a minimum length L min. of electrode is determined as follows by a minimum dimension obtainable in IC technology: $L_i \geq$ L min.

Furthermore, the length of electrode should not be lengthen as far as a maximum length L max. so as not to worsen the transfer characteristic by increasing charge transfer time. Therefore $$L_o \leq L \text{ max.}$$

has to be held.

To sum up the abovementioned inquality, the following relation holds:

$$r \geq A \left( \frac{L \text{ min.}}{L \text{ max.} - L \text{ min.}} \right)$$

Therefore the inner radius r has to be a length excess to a specified value, an invalid and useless area is needed. For example, in case L max. is 14 ($\mu$m) L min. is 6 ($\mu$m), and $A_w$ is 40 ($\mu$m), r has to be at least 30 ($\mu$m). When changing the transfer direction of signal charges from the arrow $F_{b1}$ to $F_{b2}$ as shown in FIG. 2, such a large semi-circle having a diameter of 60 ($\mu$m) is required, and it wastes the surface area of the IC chip.

Furthermore, it takes a long time to make a pattern of a semi-circle shape, especially a photo mask for IC.

For the explanations mentioned above, conventional method has had various kinds of defects.

SUMMARY OF THE INVENTION

The present invention purports to provide a CCD which is improved to eliminate the abovementioned disadvantages. That is, the CCD of the present invention can comprise a high surface area utilization rate in IC chip, a good frequency characteristics without the fixed pattern noise, and can be easily manufactured.

DESCRIPTION OF PREFERRED EMBODIMENTS

The CCD in accordance with the present invention comprises, a first transferring channel region to transfer signal charges to a first direction, a second transferring channel region to transfer signal charges to a second direction, a third transferring channel region to change transfer direction from the first direction to the second direction, which part is disposed between the first and second transferring channel region and consisting of a plurality of the bent storage sites having an electrode thereon and those of which comprises a first part having right angle to the first direction and a second part having right angle to the second direction. Each of the storage sites in first, second and third transferring channel regions of a plurality of storage sites being defined by an edge of the channel region and an edge of the electrode disposed thereon in a semiconductor substrate, with signal charge being stored or transferred from one storage site to the next storage site responding to signals impressed on the electrode thereon.

Figure 4:
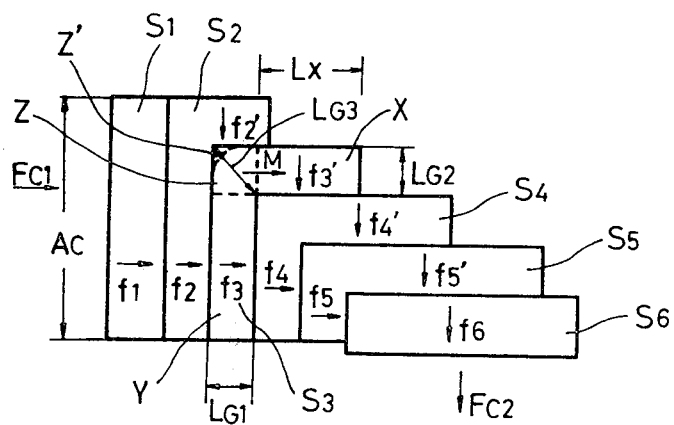
FIG. 4 is a schematic plan view of a CCD of the present invention.

FIG. 4 shows a schematic plan view of a CCD for explaining the basic principle of the present invention for changing the charge signals transferring direction from that along an arrow $F_{c1}$ into that of an arrow $F_{c2}$.

In FIG. 4, symbols of $S_1$, $S_2$, $S_3$, $S_4$, $S_5$ and $S_6$ respectively show storage sites of a channel $A_c$ of the CCD with omitting minor transfer sites between these storage sites $S_1$ to $S_6$. The rectangular shaped storage site $S_1$ is in contact with the L-shaped storage site $S_2$. The L-shaped storage sites $S_2$, $S_3$, $S_4$ and $S_5$ are respectively in contact with the next storage sites $S_3$, $S_4$, $S_5$ and $S_6$ and their shapes are gradually changing to the rectangular shaped storage site $S_6$ as shown in FIG. 4. Arrows $f_1$, $f_2$, $f_2'$ ... $f_5$, $f_5'$ and $f_6$ show the directions to transfer signal charges in each storage sites $S_1$ to $S_6$.

Generally speaking, charge signal transfer operation of a CCD can be divided into two main stages according to the transferring time. At a first stage, which is very short period namely at most a few nano-seconds, when signal charges is intensely accumulating at a storage site, the signal charges are sent with a very high speed by so called self induced field (briefly speaking a field generated by an accumulation of the same polarity charges and their resultant repulsion from each other). Therefore, a major signal charges are transferred into a next storage site in a very short time. Next, a minor signal charges remaining in the storage site of the sending side, for example 1% of whole signal charges, are transferred into the next stage at a relatively slow speed by the thermal diffusion phenomenon of carrier and weak drift fields due to the structure of the CCD. In the ordinary CCD, when the amount of signal charges remaining in the sending side storage site becomes under 0.01% of whole signal charges, it is considered that the transfer operation of charge signals is approximately finished. Accordingly the time period from the end of the first stage till the time when remaining signal charge reaches 0.01% can be considered a second stage. In the frequency characteristics of a CCD, it says that the wider the width of the electrodes make, the worse the high frequency characteristic becomes, this is because the transfer speed at the abovementioned second stage becomes slower in inverse proportion to the second or third power to the width of the electrodes. For example, a buried channel CCD having 12 μm width electrodes starts becomes worse for frequency of over 18 MHz. while other CCD having 16 μm width electrodes does so over 9 MHz.

In the meantime, signal charge transfers at the L-shaped storage sites of the present invention are mentioned below. In order to analyze the signal charge transfer under an electrode, we divide our consideration into the following two cases, one of them is sending of signal charges from a storage site we are considering to the next storage site and the other is receiving the signal charges from the prestage storage site.

With regard to signal charge transfer into the next storage site, a distance of charge transfer has direct effects upon the transfer characteristic of the CCD. In FIG. 4, the L-shaped storage site $S_3$ can be divided into two small rectangular parts X and Y and one approximately square part Z at the corner. The distances of charge transfer from these parts X and Y to the next storage site $S_4$ are at most $L_{G1}$ and $L_{G2}$, respectively. Therefore the distances of charge transfer $L_{G1}$ and $L_{G2}$ should be shorter than a specified length in order not to worsen the transfer characteristic, namely L max. mentioned in the prior art. In the corner part Z, the distance of charge transfer may be $L_{G3}$ which is larger than the distance of charge transfer $L_{G1}$ and $L_{G2}$. Therefore the distance of charge transfer $L_{G3}$ is preferably shorter than the maximum length L max. However, even if the distance of charge transfer $L_{G3}$ is longer than the maximum length L max., a farther partial area $Z'$ of the corner part Z where transfer distances are longer than the maximum length L max. is very narrow and therefore the signal charges of such narrow area $Z'$ is little as compared with the signal charges of the storage site $S_3$ excluded of the signal charges of the part $Z'$. The signal charges of the part $Z'$ is negligibly small. Therefore in order to transfer signal charges into next storage site, it is sufficient that only $L_{G1}$ and $L_{G2}$ are shorter than L max.

Next, with regard to signal charge transfer from the prestage storage site, the signal charges are transferred from the storage site $S_2$ to the parts Y and Z of the storage site $S_3$ with no problem, because the distances of charge transfer in $f_2$ or $f_2'$ transfer directions are short enough. But at a glance it seems to take a long time to transfer signal charges from the parts Y and Z to the part X, since the distance of charge transfer to the part X is not short as shown in FIG. 4. Then the signal charge transfer mechanism in this case is mentioned further in detail. At first, most of signal charges, e.g. more than 99% of whole signal charges are transferred from the storage site $S_2$ to the parts Y and Z in a short time, and there are many signal charges in these parts Y and Z immediately after a transfer starting. At that time, a high self-induced field M as shown in FIG. 4 generates based on these signal charges. Since signal charges in the parts Y and Z are drifted by the self-induced field M into the part X of the storage site $S_3$ at high speed, it takes a only small time, so that the signal charges distribute in the part X uniformly. The signal charge transfer operation from the parts Y and Z to the part X corresponds to the abovementioned first stage, and it finishes within a short time. The 1% signal charges in the former storage site $S_2$ are transferred to the parts Y and Z within a time period of one clock frequency and the remainder becomes to e.g. 0.01% of the signal charges as residual charge.

In case the amount of signal charges transferring the channel of CCD are very little from the first, a sufficiently large self-induced field is not generated, and therefore, it may happen that a period to transfer signal charge from the prestage storage site $S_2$ to the storage site terminates by the end of uniform distribution of signal charges to the part X. However, even if the signal charges do not distribute uniformly in the part X, it does not make a problem, since it is not a length $L_x$ but the transfer distances $L_{G1}$ or $L_{G2}$ that decides the transfer time when transferring to the next stage storage site $S_4$. Therefore, the transfer speed does not become worse in such cases.

For the reasons mentioned above, width of the electrodes determines frequency characteristics of CCD because the wider the electrodes are, the greater the distances of charge transfer are. That is to say, not the length $L_x$ of the storage site but the distances $L_{G1}$ and $L_{G2}$ of charge transfer decide the frequency characteristics of the CCD. Therefore a transfer direction can be changed by a plurality of bent storage sites increasing their parts crossing at right angles to a direction to be changed responding to a distance from the straight part of channels keeping the distance of charge transfer less than that of L max.

Figure 1A:
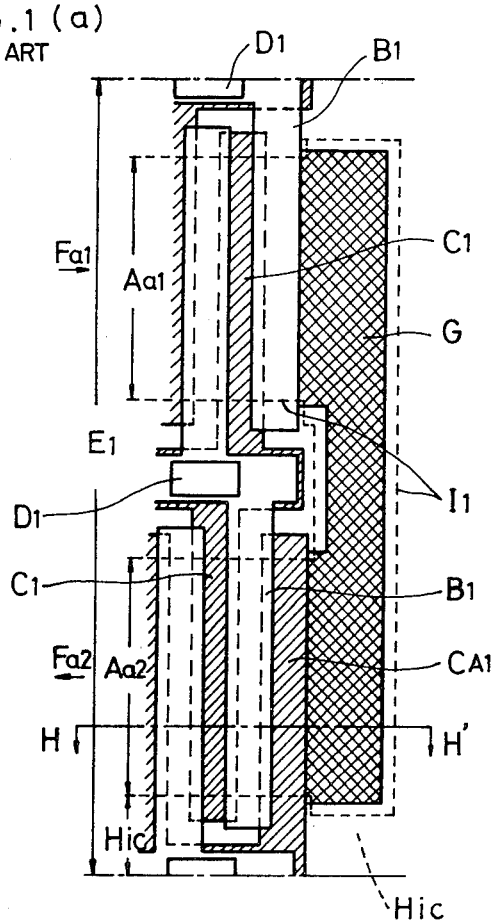
FIG. 1(a) is a top view of a turning part of a conventional CCD.
Figure 1B:
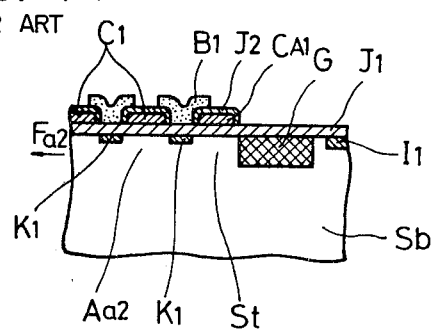
FIG. 1(b) is a sectional view taken on line H-H' of FIG. 1(a).
Figure 2:
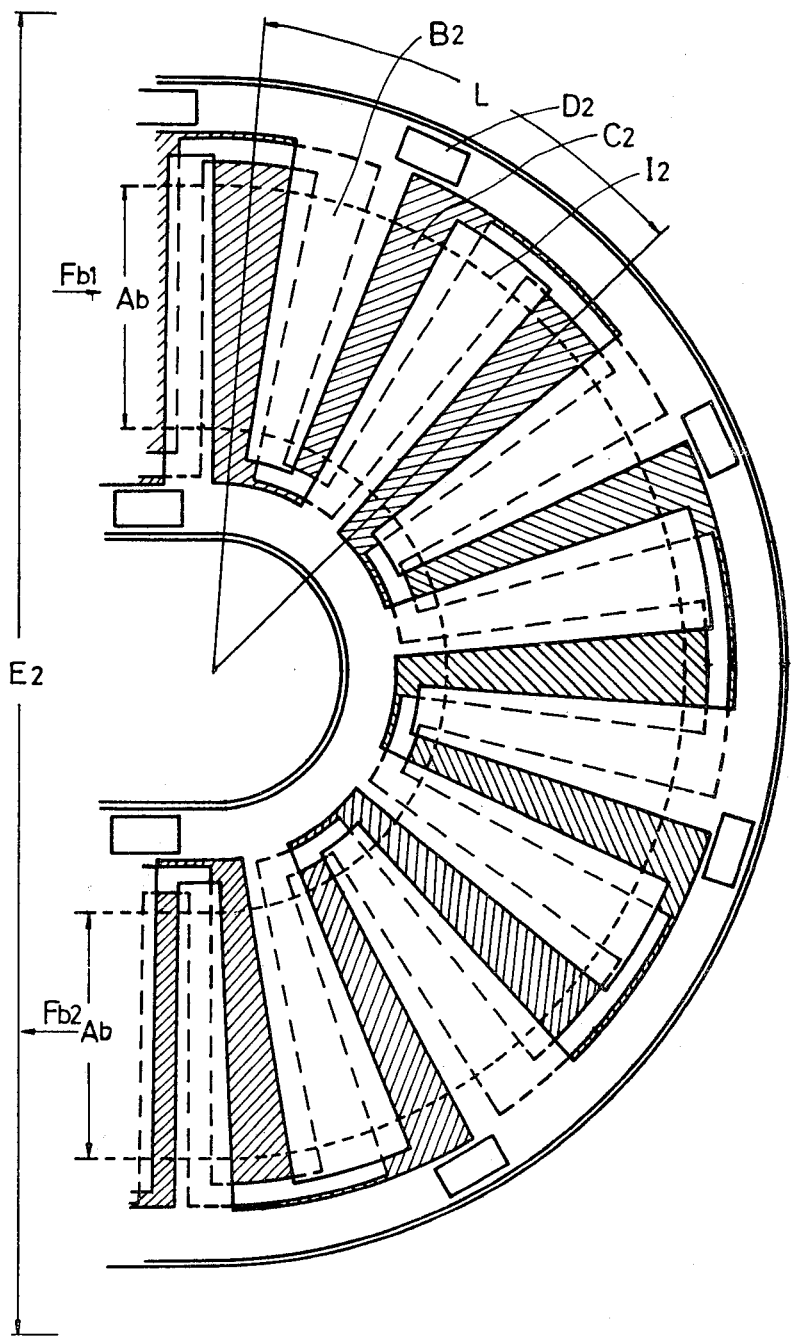
FIG. 2 is a top view of a turning part of another conventional CCD.
Figure 3:
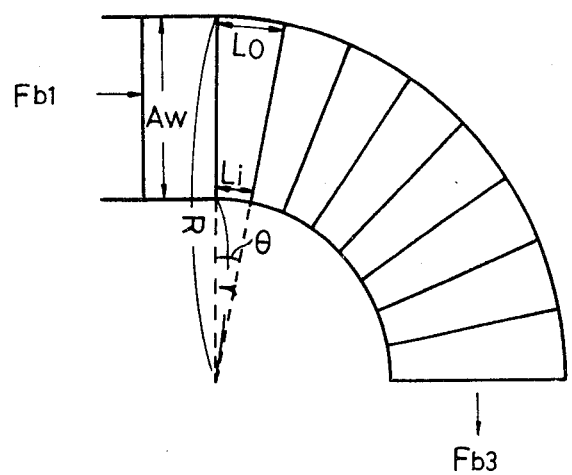
FIG. 3 is a schematic illustration of channel of FIG. 2.
Figure 5A:
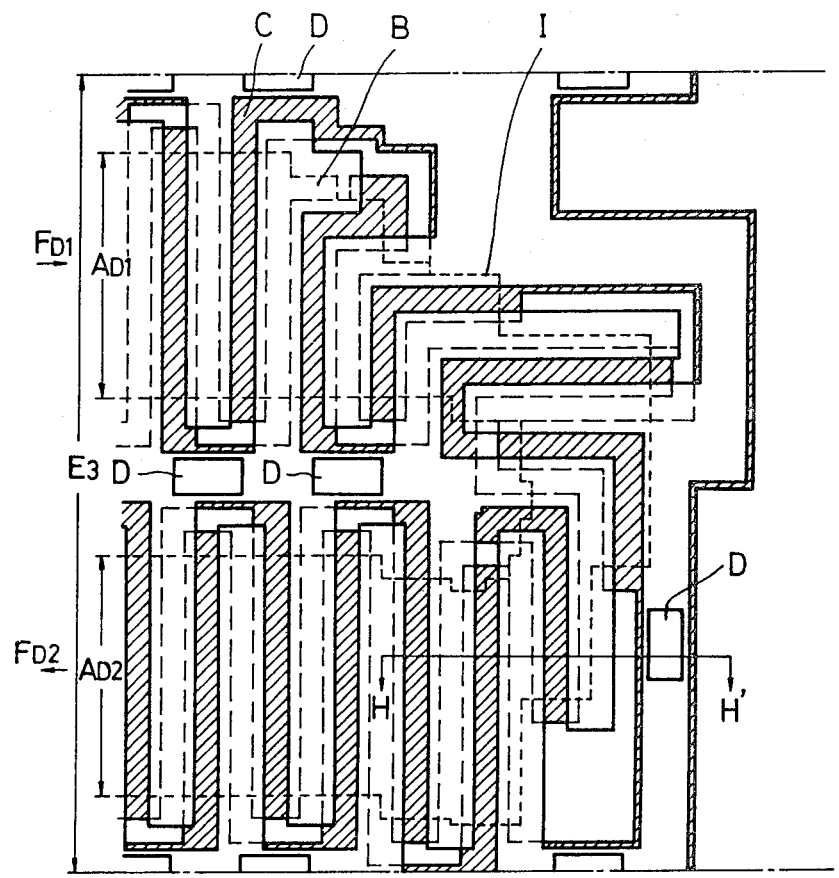
FIG. 5(a) is a plan view of an embodiment of a CCD of the present invention.
Figure 5B:
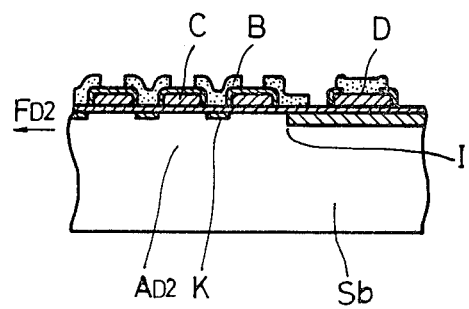
FIG. 5(b) is a sectional view taken on line H-H' of FIG. 5(a).
Figure 5C:
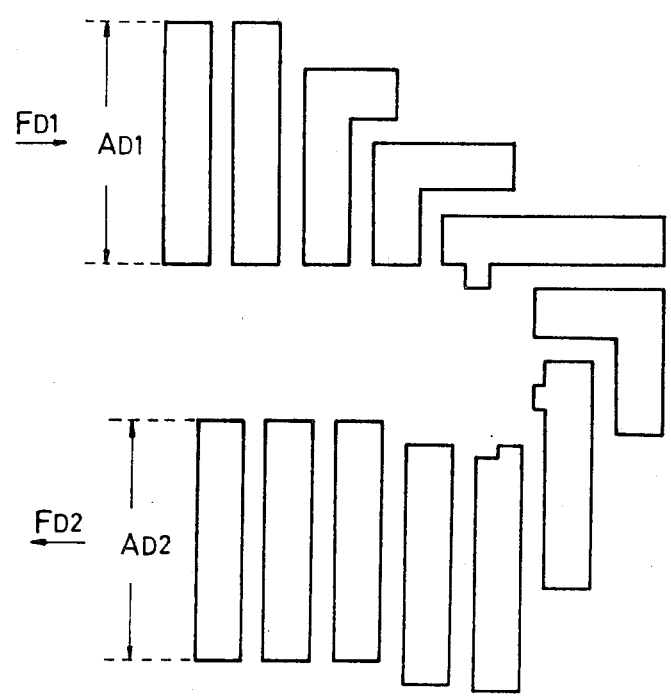
FIG. 5(c) is a plan view for schematic illustration of storage sites of FIG. 5(a).

FIG. 5 is a two-phase CCD of an embodiment of the present invention to inverse the transfer direction using a combination of configurations shown in FIG. 4. FIG. 5(a) is a top view and FIG. 5(b) is a sectional view taken along the lines H-H' of FIG. 5(a). FIG. 5(c) shows storage sites picked out of FIG. 5(a). In FIGS. 5(a) and 5(b), symbols $A_{D1}$, $A_{D2}$, B, C, D, $F_{D1}$, $F_{D2}$, I and K respectively correspond to the channels $A_{a1}$, $A_{a2}$, electrodes $B_1$, $C_1$, contacts $D_1$, the end line of the channel stop $I_1$, and the impurity layer $K_1$ of FIG. 1. In this embodiment the end line I bounds borders of the channel $A_{D1}$ and $A_{D2}$. And the distances of charge transfer $L_{G1}$, $L_{G2}$ correspond not to the width of the gate electrodes C per se but to the storage sites and should be selected less than the length of L max. Furthermore, in this embodiment, each area of storage sites is selected substantially the same. As clearly shown in FIG. 5(c), the useless area as seen in the prior art of FIG. 2 on the IC chip can be completely omitted.

Figure 6:
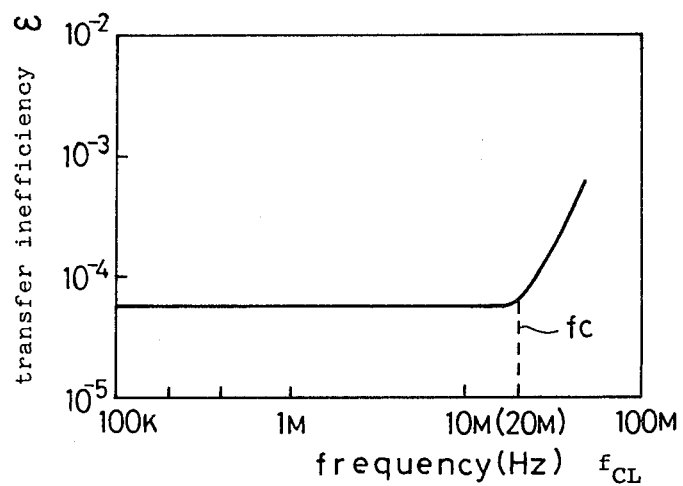
FIG. 6 is a graph of a frequency characteristic of the embodiment of FIG. 5 of the present invention.

FIG. 6 shows a transfer characteristic of this CCD having 11 times-transfer turnings, showing clock frequency $f_{CL}$ of CCD on abscissa, and transfer inefficiency $\epsilon$ on the ordinate. As indicated in FIG. 6, a clock frequency $f_c$ above which the transfer inefficiency $\epsilon$ rises is a practical upper limit of clock frequency for the CCD in a proper charge transfer operation. In this embodiment, gate length at direct parts is selected 10 μm. The limit clock frequency $f_c$ (20 MHz) of this CCD having a gate length of 10 μm is considered an ordinary value as compared with the abovementioned examples of the prior arts, and is further considered that the transfer characteristic is not deteriorated by the 11 times-transfer turnings.

In the meantime, the CCD of the present invention used as a temporary memory device is elucidated below. The first CCD mentioned in the prior arts, a dark current is a severe problem since it generates fixed pattern noises at such operation. In the present invention, a large fixed pattern noise is not generated in itself because there are no extreme ununiformity in the channels such as high conductive regions G. However, if amounts of dark current generated in each of storage sites are not uniform, the ununiformity still makes noise when information of CCD is read out. Generally speaking, dark current generated in CCD is mainly in proportion to the areas of the storage sites, and thereby, it is of great importance for reducing the fixed pattern noise that each of storage sites are made to have equal area. Accordingly, in the present invention, the areas of storage sites in the transfer turning parts and that in straight channel should be substantially the same value in order to reduce the generation of fixed pattern noise. In fact, it is quite easy to design the CCD of the present invention so as to make the areas of the storage sites equal.

Figure 7:
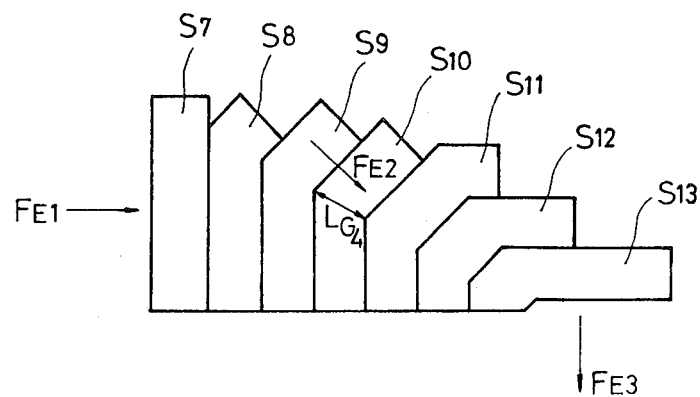
FIG. 7 is a schematic plan view of another embodiment of a CCD of the present invention.

FIG. 7 shows another embodiment of the present invention. In FIG. 7, symbols $S_7$, $S_8$, . . . $S_{12}$, and $S_{13}$ designate storage sites, respectively. Changing of the transfer direction by 90° is made in a different manner from that of the foregoing example. Namely, in this embodiment the direction change is made from $F_{E1}$ to $F_{E2}$ and then it is further changed to $F_{E3}$ as shown in FIG. 7. In this embodiment, the configurations of the storage sites are changed so as to have gradually longer parts vertical to transfer directions to change in steps. By use of such constructions, a distance of charge transfer $L_{G4}$ at a vertex point of $S_{10}$ in FIG. 7 can be made shorter than that of $L_{G3}$ in FIG. 4. In FIG. 4, the part Z' where distances of charge transfer are larger than the distance of L max. at each of vertex point, while in this embodiment the distance of charge transfer at the vertex is not so larger than the distance of L max. Therefore adverse effect of such part can be almost negligible.

By the way, in changing the direction of the transfer of this CCD, it is practical to change the direction by angles of integer multiples of 45°. Because they are considered standard angles when making photo-masks for IC chips and easy to produce. Furthermore it is convenient in designing to select such angles, since changings of transfer direction of CCDs are selected in 90° or 180° in almost all cases.

In the abovementioned embodiments, though the changings of transfer directions in 90° or 180° are elucidated, the present invention can be applied to change transfer directions in other angles for examples 60°.

Furthermore FIG. 5 shows the example of so called the two-phase CCD, changing transfer direction can be realized in any other kind of CCD (for example three or four-phase CCD) based on the principle mentioned in FIGS. 4 and 7.

According to the present invention, we can achieve the following advantages:

(i) there is no problem due to the diffused region since it dispenses with such diffused region, (ii) the surface area utilization rate in the IC chip can be improved, and (iii) it is easy to manufacture since the IC does not have such pattern to take a long time to produce as a pattern of a semi-circle shape.

What I claim is

1. A charge-coupled device having one input and one output terminal for signal charge and unique charge transfer channel between said input and output terminal comprising:

a first transferring channel region to transfer signal charges to a first direction consisting of a plurality of rectangular storage sites whose both longer sides have a right angle to said first direction, a second transferring channel region to transfer signal charges to a second direction consisting of a plurality of rectangular storage sites, whose both longer sides have a right angle to said second direction, a third transferring channel region to change transfer direction from said first direction to said second direction, which region is disposed between said first and second transferring channel regions consisting of a plurality of bent storage sites having an electrode thereon and those of which comprise a first rectangular part, one pair of whose sides having a right angle to said first direction, a second rectangular part one pair of whose sides having a right angle to said second direction, and a third rectangular part one pair of whose sides having a right angle to a specified direction which is between said first and second directions, and having the charge transfer path to said next storage site through one side of said each pair, and the distance between the sides of said each pair being shorter or equal to that of the longer sides of said first or second transferring channel region, each of said storage sites in said first, second and third transferring channel regions being defined by an edge of said channel region and an edge of electrode disposed thereon in a semiconductor substrate, with signal charge being stored or being transferred from one storage site to the next storage site responding to signals impressed on said electrode thereon.

2. A charge-coupled device in accordance with claim 1 wherein said specified direction is an angle of 45° with respect to said first direction.

3. A charge-coupled device in accordance with claim 1, wherein the area of each of said storage sites in said third transferring channel region is the same as that of said first and second transferring channel regions.

4. A charge-coupled device having one input and one output terminal for signal charge and unique charge transfer channel between said input and output terminal comprising:

a first transferring channel region to transfer signal charges to a first direction consisting of a plurality of rectangular storage sites whose both longer sides have a right angle to said first direction, a second transferring channel region to transfer signal charges to a second direction consisting of a plurality of rectangular storage sites, whose both longer sides have a right angle to said second direction, a third transferring channel region to change transfer direction from said first direction to said second direction, which region is disposed between said first and second transferring channel regions consisting of a plurality of bent storage sites having an electrode thereon which comprise a first rectangular part, one pair of whose sides having a right angle to said first direction, and an additional rectangular part one pair of whose sides having a right angle to a specified direction which is between said first and second directions and having the charge transfer path to said next storage site through one side of said each pair, and the distance between the sides of each said pair being shorter or equal to that of the longer sides of said first or second transferring channel region, each of said storage sites in said first, second and third transferring channel regions being defined by an edge of said channel region and an edge of electrode disposed thereon in a semiconductor substrate, with signal charge being stored or being transferred from one storage site to the next storage site responding to signals impressed on said electrode thereon.

* * * * *